(12) United States Patent
Tanabe et al.

(10) Patent No.: US 10,536,571 B2
(45) Date of Patent: Jan. 14, 2020

(54) ELECTRONIC DEVICE HAVING A NON-CONTACT DETECTION SENSOR AND CONTROL METHOD

(71) Applicant: KYOCERA Corporation, Kyoto (JP)

(72) Inventors: Shigeki Tanabe, Yokohama (JP); Hideki Morita, Yokohama (JP); Isao Masuike, Machida (JP); Shinya Saito, Kawasaki (JP); Yasushi Kitamura, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/351,307

(22) Filed: Mar. 12, 2019

(65) Prior Publication Data

US 2019/0215392 A1    Jul. 11, 2019

Related U.S. Application Data

(62) Division of application No. 15/654,872, filed on Jul. 20, 2017, now Pat. No. 10,298,732.

(30) Foreign Application Priority Data

Jul. 27, 2016   (JP) .................................. 2016-147890

(51) Int. Cl.
*H04M 1/60*      (2006.01)
*G06F 3/01*      (2006.01)
(Continued)

(52) U.S. Cl.
CPC ............ *H04M 1/605* (2013.01); *G06F 3/017* (2013.01); *G06F 3/0304* (2013.01);
(Continued)

(58) Field of Classification Search
None
See application file for complete search history.

(56) References Cited

U.S. PATENT DOCUMENTS 9,501,150 B2 * 11/2016 Rodgers ................. G06T 13/80
9,684,378 B2 *  6/2017 Lazaridis ............... G06F 3/017
(Continued)

FOREIGN PATENT DOCUMENTS

JP      2011-192081 A      9/2011
JP      2013-534009 A      8/2013
(Continued)

OTHER PUBLICATIONS

An Office Action issued by the Japanese Patent Office dated Oct. 3, 2017, of the prior Japanese Patent Application No. 2016-147890 and is related to U.S. Appl. No. 15/654,872; with English Concise Explanation.

(Continued)

*Primary Examiner* — John F Mortell
(74) *Attorney, Agent, or Firm* — Studebaker & Brackett PC

(57) ABSTRACT

An electronic device includes a first non-contact detection sensor, a second non-contact detection sensor, a display, and a controller. The controller determines a first gesture and a second gesture by referring to the first non-contact detection sensor and a second non-contact detection sensor. The controller, when a first window and a second window are displayed on the display, allocates operation of the first window to the first gesture detected by the first non-contact detection sensor, and allocates operation of the second window to the second gesture detected by the second non-contact detection sensor.

12 Claims, 8 Drawing Sheets

(51) Int. Cl.
  *H04M 1/725* (2006.01)
  *G06F 3/03* (2006.01)
  *H03G 3/30* (2006.01)
  *H04W 52/02* (2009.01)
  *H04M 1/02* (2006.01)

(52) U.S. Cl.
  CPC ...... *H03G 3/3026* (2013.01); *H04M 1/72519* (2013.01); *H04M 1/72563* (2013.01); *H04W 52/0254* (2013.01); *H04M 1/0245* (2013.01); *H04M 2250/10* (2013.01); *H04M 2250/12* (2013.01); *H04M 2250/22* (2013.01); *Y02D 70/00* (2018.01); *Y02D 70/1262* (2018.01); *Y02D 70/142* (2018.01); *Y02D 70/144* (2018.01); *Y02D 70/146* (2018.01); *Y02D 70/164* (2018.01); *Y02D 70/166* (2018.01)

(56) References Cited

U.S. PATENT DOCUMENTS

| | | |
|---|---|---|
| 2011/0310005 A1 | 12/2011 | Chen et al. |
| 2012/0254790 A1* | 10/2012 | Colombino ........... G06F 3/0482 715/781 |
| 2013/0097556 A1* | 4/2013 | Louch ................... G06F 3/0488 715/790 |
| 2014/0164990 A1* | 6/2014 | Kim .................... G06F 3/04817 715/790 |
| 2014/0282273 A1 | 9/2014 | Anderson |
| 2015/0116206 A1 | 4/2015 | Irie |
| 2015/0346831 A1 | 12/2015 | Nii |
| 2016/0117513 A1* | 4/2016 | Shariq ..................... G06F 21/60 726/27 |
| 2016/0139804 A1 | 5/2016 | Hsu et al. |
| 2017/0131894 A1* | 5/2017 | de Moraes ............ G06F 3/0488 |

FOREIGN PATENT DOCUMENTS

| | | |
|---|---|---|
| JP | 2015-087824 A | 5/2015 |
| JP | 2015-127976 A | 7/2015 |
| JP | 2015-225493 A | 12/2015 |
| JP | 2016-512632 A | 4/2016 |

OTHER PUBLICATIONS

An Office Action issued by the Japanese Patent Office dated Oct. 18, 2016, of the prior Japanese Patent Application No. 2016-147890, with English language Concise Explanation.

An Office Action issued by the Japanese Patent Office dated Nov. 29, 2016, of the prior Japanese Patent Application No. 2016-147890, with English language Concise Explanation.

An Office Action issued by the Japanese Patent Office dated Mar. 21, 2017, of the corresponding Japanese Patent Application No. 2017-027305, with English language Concise Explanation.

* cited by examiner

ELECTRONIC DEVICE HAVING A NON-CONTACT DETECTION SENSOR AND CONTROL METHOD

CROSS-REFERENCE TO RELATED APPLICATION

This application claims priority to and the benefit of Japanese Patent Application No. 2016-147890 filed Jul. 27, 2016, the entire contents of which are incorporated herein by reference.

TECHNICAL FIELD

This disclosure relates to an electronic device and a control method.

BACKGROUND

For example, a mobile terminal that uses an infrared sensor to recognize a gesture is known.

Such a mobile terminal then processes an input operation corresponding to the gesture on a window being displayed.

SUMMARY

Only one window is displayed on the aforementioned mobile terminal.

Therefore, it would be helpful to provide an electronic device that can improve operability for a plurality of windows.

An electronic device according to one aspect includes:
a first non-contact detection sensor;
a second non-contact detection sensor;
a display; and
a controller configured to determine a first gesture and a second gesture by referring to output of the first non-contact detection sensor and the second non-contact sensor;
such that the controller, when a first window and a second window are displayed on the display,
   allocates operation of the first window to the first gesture detected by the first non-contact detection sensor, and
   allocates operation of the second window to the second gesture detected by the second non-contact detection sensor.

An electronic device according to another aspect includes:
a first non-contact detection sensor;
a second non-contact detection sensor;
a display; and
a controller configured to determine a first gesture and a second gesture by referring to output of the first non-contact detection sensor and the second non-contact detection sensor;
such that the controller, when a first window and a second window are displayed on the display,
   allocates the first gesture detected by the first non-contact detection sensor to an operation to select between the first window and the second window, and
   allocates the second gesture detected by the second non-contact detection sensor to an operation of whichever of the first window and the second window is selected.

A control method according to another aspect is for an electronic device including a first non-contact detection sensor and a second non-contact detection sensor, the control method including:
displaying a first window and a second window on a display;
determining a first gesture and a second gesture by referring to output of the first non-contact detection sensor and a second non-contact detection sensor;
allocating operation of the first window to the first gesture detected by the first non-contact detection sensor, and allocating operation of the second window to the second gesture detected by the second non-contact detection sensor.

A control method according to another aspect is for an electronic device including a first non-contact detection sensor and a second non-contact detection sensor, the control method including:
displaying a first window and a second window on a display;
determining a first gesture and a second gesture by referring to output of the first non-contact detection sensor and a second non-contact detection sensor;
allocating the first gesture detected by the first non-contact detection sensor to an operation to select between the first window and the second window, and
allocating the second gesture detected by the second non-contact detection sensor to an operation of whichever of the first window and the second window is selected.

The electronic device according to one of the embodiments of this disclosure can improve the operability of a plurality of windows.

DETAILED DESCRIPTION

Figure 1:
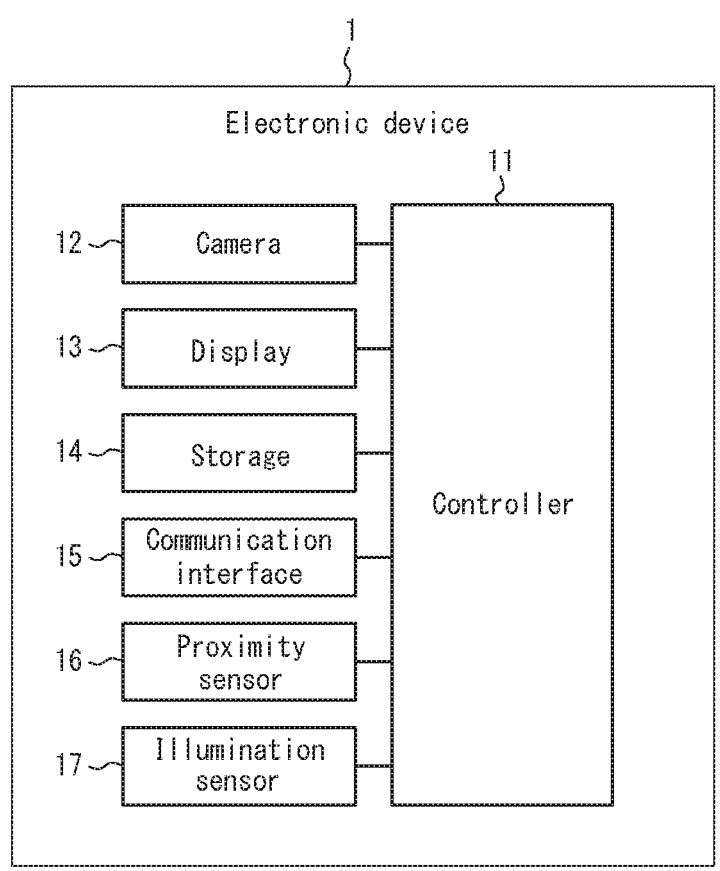
FIG. 1 is a schematic configuration diagram of an electronic device according to one embodiment.

As illustrated in FIG. 1, an electronic device 1 according to one embodiment includes a controller 11, a camera 12, a display 13, a storage 14, a communication interface 15, a proximity sensor (gesture sensor) 16, and an illumination sensor 17. Since FIG. 1 is only an example, the electronic device 1 need not include all of the components illustrated in FIG. 1. Also, the electronic device 1 may include components other than those illustrated in FIG. 1.

The controller 11 is a processor such as a Central Processing Unit (CPU). The controller 11 may be a System-on-a-Chip (SoC) or other type of integrated circuit in which other components are integrated. The controller 11 may be configured by combining a plurality of integrated circuits.

The controller 11 implements a variety of functions by comprehensively controlling operations of the electronic device 1.

In greater detail, the controller 11 refers as necessary to data stored in the storage 14. The controller 11 implements a variety of functions by executing instructions included in programs stored in the storage 14 to control other functional components, such as the display 13.

The camera 12 captures images of subjects around the electronic device 1. As an example, the camera 12 in one embodiment is a front camera provided on the face of the electronic device 1 where the display 13 is provided. The camera 12 is one example of a non-contact detection sensor and can detect a gesture by the user by referring to the result of image analysis performed on a captured image.

The display 13 is provided with a display device such as a liquid crystal display or an organic electro-luminescence panel. The display 13 may instead be provided with an inorganic electro-luminescence panel. The display 13 can display a plurality of windows. The display 13 can display information such as letters, images, symbols, or graphics. The display 13 may include a touchscreen and detect contact on the touchscreen by a finger, stylus pen, or other object. In this case, the display 13 can detect the position on the touchscreen contacted by a plurality of fingers, stylus pens, or other objects. The display 13 is provided in the electronic device 1 in FIG. 1, but the display 13 may be provided outside of the electronic device 1.

The storage 14 functions as a memory storing programs and data. The storage 14 temporarily stores the processing result of the controller 11. For example, the storage 14 stores the type of window operation allocated to a gesture. The storage 14 may include any storage device, such as a semiconductor storage device or a magnetic storage device. The storage 14 may also include a plurality of types of storage devices. The storage 14 may include a combination of a portable storage medium, such as a memory card, and an apparatus for reading the storage medium.

The programs stored in the storage 14 include applications that run in the foreground or the background and a control program that supports operations of the applications. The applications for example cause the controller 11 to execute processing corresponding to a gesture. The control program may, for example, be an Operating System (OS). The applications and the control program may be installed on the storage 14 through wireless communication by the communication interface 15 or from a storage medium.

The communication interface 15 is for communicating over a wired or wireless connection. The communication method of the communication interface 15 in one embodiment is prescribed by a wireless communication standard. For example, a cellular phone communication standard such as 2G, 3G, or 4G may be used as the wireless communication standard. Examples of cellular phone communication standards include Long Term Evolution (LTE), Wideband Code Division Multiple Access (W-CDMA), CDMA2000, Personal Digital Cellular (PDC), Global System for Mobile communications (GSM® (GSM is a registered trademark in Japan, other countries, or both)), and Personal Handy-phone System (PHS). Examples of wireless communication standards include Worldwide Interoperability for Microwave Access (WiMAX), Institute of Electrical and Electronics Engineers (IEEE) 802.11, Bluetooth® (Bluetooth is a registered trademark in Japan, other countries, or both), Infrared Data Association (IrDA), and Near Field Communication (NFC). The communication interface 15 may support one or more of the aforementioned communication standards.

The proximity sensor 16 is one example of a non-contact detection sensor. Without contact, the proximity sensor 16 detects information such as the relative distance from an object near the electronic device 1 and the movement direction (gesture) of the object. The proximity sensor 16 in one embodiment includes four visible light photodiodes that can detect white, red, green, and blue. The proximity sensor 16 can measure the relative distance from the object. The proximity sensor 16 also includes one infrared Light Emitting Diode (LED) that acts as a light source and four infrared photodiodes that detect the up, down, left, and right directions. An object is irradiated by infrared light from the infrared LED acting as a light source, and the proximity sensor 16 detects the movement direction of the object by the difference in time at which reflected light from the object is incident on each of the infrared photodiodes. Accordingly, the proximity sensor 16 can detect an air gesture (gesture) that the user of the electronic device 1 performs without touching the electronic device 1.

The illumination sensor 17 is one example of a non-contact detection sensor and detects the degree of illumination of surrounding light that is incident on the illumination sensor 17.

Figure 2:
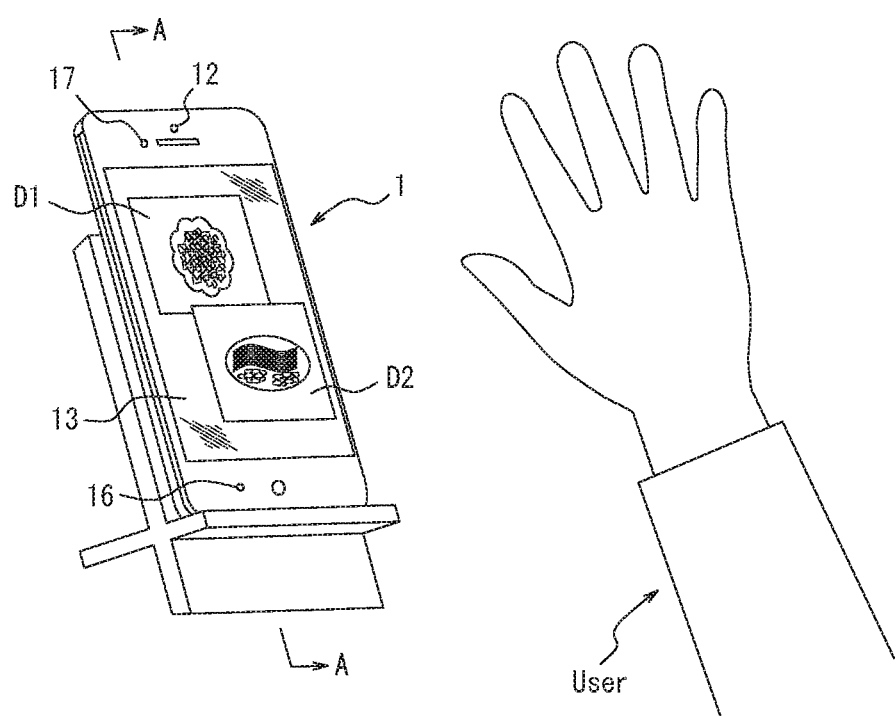
FIG. 2 is the first diagram illustrating operation of an electronic device with a gesture.

FIG. 2 illustrates the user operating the electronic device 1 with a gesture. In FIG. 2, the electronic device 1 is supported on a stand as an example. Alternatively, the electronic device 1 may be supported against a wall. The camera 12 and the illumination sensor 17 are disposed at the upper portion of the electronic device 1, and the proximity sensor 16 is disposed at the lower portion of the electronic device 1. As illustrated in FIG. 2, the display 13 can display a first screen (first window D1) and a second screen (second window D2) in partial overlap. The first window D1 and the second window D2 may correspond to the same application or to different applications. For the sake of convenience, the plurality of windows are described as including the first window and the second window in one embodiment, but three or more windows may be included.

By referring to output from the proximity sensor 16, illumination sensor 17, or camera 12, the controller 11 can determine which gesture the user performed. As an example in one embodiment, the proximity sensor 16 is described as being used as the non-contact detection sensor. In one embodiment, either the first window D1 or the second window D2 is an active window that can accept an input operation. Therefore, upon receiving an operation corresponding to a gesture, the controller 11 executes the operation corresponding to the gesture on whichever of the first window D1 and the second window D2 is the active window. The operation corresponding to the gesture may, for example, be a page forward, a page back, vertical scrolling, horizontal scrolling, a pinch-in, a pinch-out, or other such operation.

The electronic device 1 in FIG. 2 is a smartphone. Alternatively, the electronic device 1 may, for example, be a mobile phone, a phablet, a tablet PC, a feature phone, or other such device. The electronic device 1 is not limited to these examples and may be any electronic device such as a Personal Digital Assistant (PDA), remote control, portable music player, game machine, household appliance, or industrial device (Factory Automation (FA) device). Furthermore, the electronic device 1 may be any device that includes the display 13, such as a desktop PC, a bank Automatic Teller Machine (ATM), a ticket machine at a train station, a digital camera, or an e-book reader.

The electronic device 1 provided with the display 13 may also be adopted in an in-vehicle control panel mounted in the steering wheel, car navigation, or dashboard of an automobile, or may be adopted in any other type of transportation.

The processing executed by the controller 11 of the electronic device 1 in one embodiment is described below. The controller 11 determines whether the electronic device 1 has entered a predetermined mode in response to user operation. The predetermined mode in one embodiment is, for example, a kitchen mode in which an application that displays a cooking recipe on the display 13 has been launched. The predetermined mode is not limited to this example, however, and may be any mode on the electronic device 1. With the electronic device 1 in the predetermined mode, the controller 11 for example executes the following processing upon detecting that a plurality of windows displaying a plurality of cooking recipes are displayed on the display 13. In other words, while a plurality of windows are being displayed, the controller 11 can allocate operation of the first window D1 to a first gesture and operation of the second window D2 to a second gesture (first control method). Instead of the first control method, the controller 11 can also allocate the first gesture to an operation to select between the first window D1 and the second window D2 and can allocate the second gesture to operation of the first window D1 or the second window D2 (second control method). Details on the first and second control methods are provided below.

The first gesture and the second gesture may be any combination of a horizontal gesture, vertical gesture, diagonal gesture, a gesture to move closer to or away from the electronic device 1, a gesture to draw a circle clockwise, a gesture to draw a circle counterclockwise, or other such gesture. For example, the horizontal gesture is performed in a direction roughly parallel to the transverse direction of the electronic device 1. The vertical gesture is performed in a direction roughly parallel to the longitudinal direction of the electronic device 1. The diagonal gesture is performed in a plane roughly parallel to the electronic device 1 in a direction not parallel to either the longitudinal direction or the transverse direction of the electronic device 1.

Next, the first and second control methods executed by the controller 11 are described in detail. For example, in accordance with a user setting, the controller 11 determines which of the first control method and the second control method to execute.

First Control Method

Upon determining that the display 13 is displaying the first window D1 and the second window D2, the controller 11 allocates operation of the first window D1 to the first gesture and operation of the second window D2 to the second gesture. For example, the controller 11 allocates a vertical scrolling operation on the first window to a horizontal gesture and allocates a vertical scrolling operation on the second window to a vertical gesture.

Figure 3:
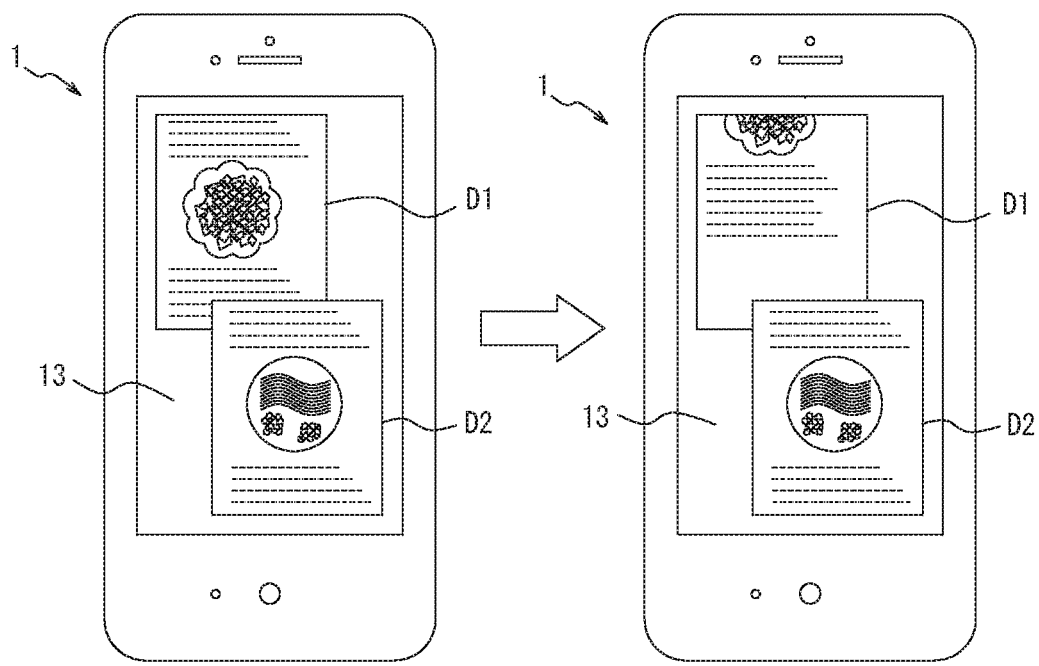
FIGS. 3A and 3B illustrate operation of a first window with a gesture.

When the controller 11 detects a horizontal gesture by the user in the state illustrated in FIG. 3A, the controller 11 scrolls the first window D1 vertically. As a result, the display 13 displays the window illustrated in FIG. 3B.

Figure 4:
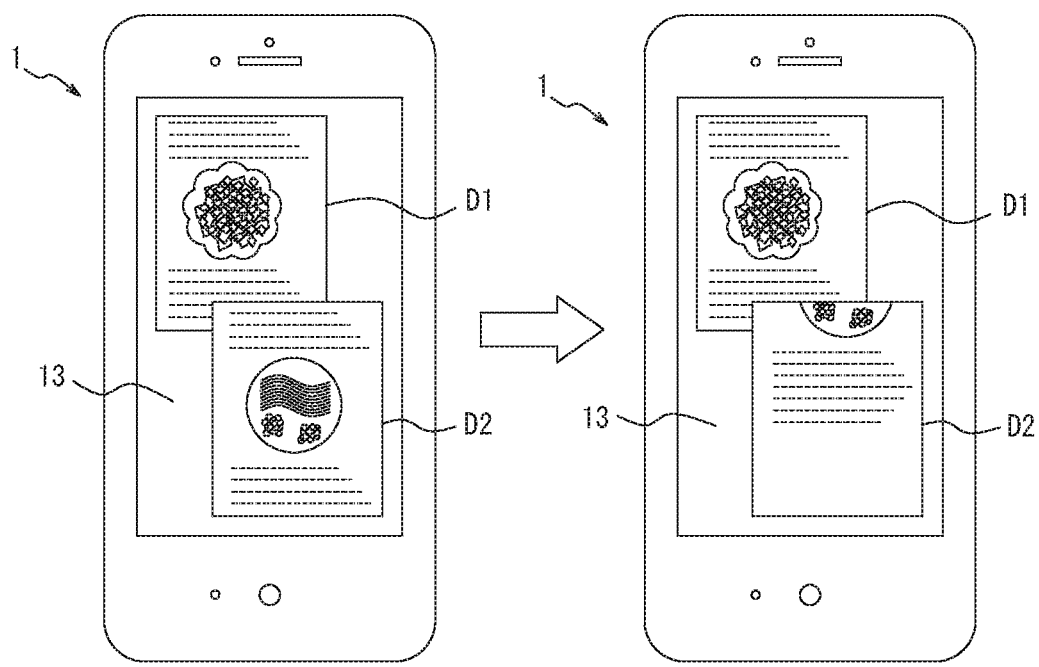
FIGS. 4A and 4B illustrate operation of a second window with a gesture.

When the controller 11 detects a vertical gesture by the user in the state illustrated in FIG. 4A, the controller 11 scrolls the second window D2 vertically. As a result, the display 13 displays the window illustrated in FIG. 4B.

Other Embodiment of First Control Method

Depending on the position passed through by the object of detection, such as the user's hand, the controller 11 can switch the active window.

Figure 5:
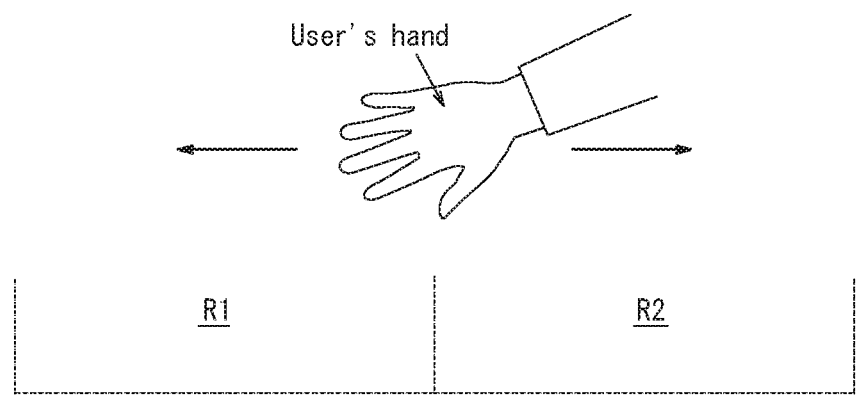
FIG. 5 is the second diagram illustrating operation of an electronic device with a gesture.

FIG. 5 is a cross-section along the A-A line in FIG. 2. The controller 11 can freely set the borderline between an upper area R1 and a lower area R2 in the space above the electronic device 1. The upper area R1 illustrated in FIG. 5 is the area above the electronic device 1 at the upper half when viewing the front of the electronic device 1. The lower area R2 illustrated in FIG. 5 is the area above the electronic device 1 at the lower half when viewing the front of the electronic device 1. The distance between the electronic device 1 and either the upper area R1 or the lower area R2 is, for example, 100 mm. Using the proximity sensor 16, the controller 11 determines whether the user has performed a gesture in either of the upper area R1 and the lower area R2 (or another area).

The controller 11 allocates operation of the first window to a gesture performed in the upper area R1 and allocates operation of the second window to a gesture performed in the lower area R2.

In other words, when determining that a gesture has been performed on the upper area R1, the controller 11 executes an operation on the first window in accordance with the detected gesture. For example, when determining that the first gesture (for example, a vertical gesture) has been performed on the upper area R1, the controller 11 may execute a first operation (for example, vertical scrolling) on the first window. When determining that the second gesture (for example, a horizontal gesture) has been performed on the upper area R1, the controller 11 may execute a second operation (for example, horizontal scrolling) on the first window.

On the other hand, when determining that a gesture has been performed on the lower area R2, the controller 11 executes an operation on the second window in accordance with the detected gesture. For example, when determining that the first gesture (for example, a vertical gesture) has been performed on the lower area R2, the controller 11 may execute a third operation (for example, page forward) on the second window. When determining that the second gesture (for example, a horizontal gesture) has been performed on the lower area R2, the controller 11 may execute a fourth operation (for example, page back) on the second window.

The following illustrates a method for more accurately determining the area in which the user performed a gesture.

Figure 6:
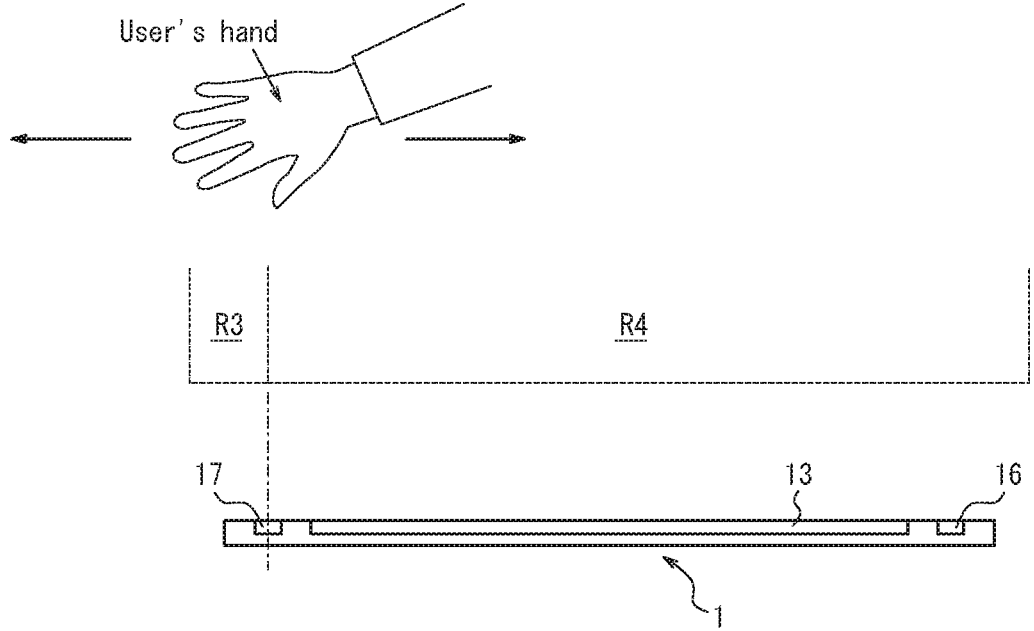
FIG. 6 is the third diagram illustrating operation of an electronic device with a gesture.

FIG. 6 is a cross-section along the A-A line in FIG. 2. The upper area R3 and the lower area R4 illustrated in FIG. 6 are areas in the space above the electronic device 1. The borderline between the upper area R3 and the lower area R4 is in a plane that passes through the illumination sensor 17 and is parallel to the transverse direction of the electronic device 1. When the user's hand is in the upper area R3 illustrated in FIG. 6, the user's hand or wrist is located above the illumination sensor 17 (upward in FIG. 6). At this time, a portion of the light incident on the illumination sensor 17 is obstructed by the user's hand or wrist, making the illuminance output by the illumination sensor 17 lower than when the user's hand or wrist is not located above the illumination sensor 17. Conversely, when the user's hand is in the lower area R4, the user's hand or wrist is not located above the illumination sensor 17. At this time, the light incident on the illumination sensor 17 is nearly unobstructed by the user's hand or wrist, making the illuminance output by the illumination sensor 17 higher than when the user's hand or wrist is located above the illumination sensor 17.

Therefore, by acquiring and determining the degree of change in the output from the illumination sensor 17 while acquiring the output from the proximity sensor 16, the controller 11 may determine whether the user performed a gesture in the upper area R3 or in the lower area R4. With this determination, the controller 11 for example can allocate operation of the first window to a gesture performed in the upper area R3 and allocate operation of the second window to a gesture performed in the lower area R4.

As described above, in the first control method, the controller 11 allocates operation of the first window to the first gesture and operation of the second window to the second gesture. As a result, for example when cooking, the user can display different windows for a plurality of recipes and perform operations on the windows without contacting the electronic device 1. The operability of a plurality of windows is thereby improved.

Second Control Method

Next, the second control method is described. The controller 11 allocates the first gesture to an operation to select between the first window and the second window. The controller 11 can also allocate the second gesture to an operation of whichever of the first window and the second window is selected. For example, when only vertical scrolling is possible on both of the first window and the second window, and horizontal scrolling is not possible on either window, the controller 11 allocates a horizontal gesture to an operation to select which of the first window and the second window to make active. The controller 11 allocates a vertical gesture to a vertical scrolling operation on whichever of the first window and the second window is the selected, active window.

In the second control method, the controller 11 allocates the first gesture to an operation to select between the first window and the second window and allocates the second gesture to an operation on whichever of the first window and the second window is selected. As a result, the user can select the window he wants to operate without contacting the electronic device 1 and can execute an operation on the window. The operability of a plurality of windows is thereby improved.

Figure 7:
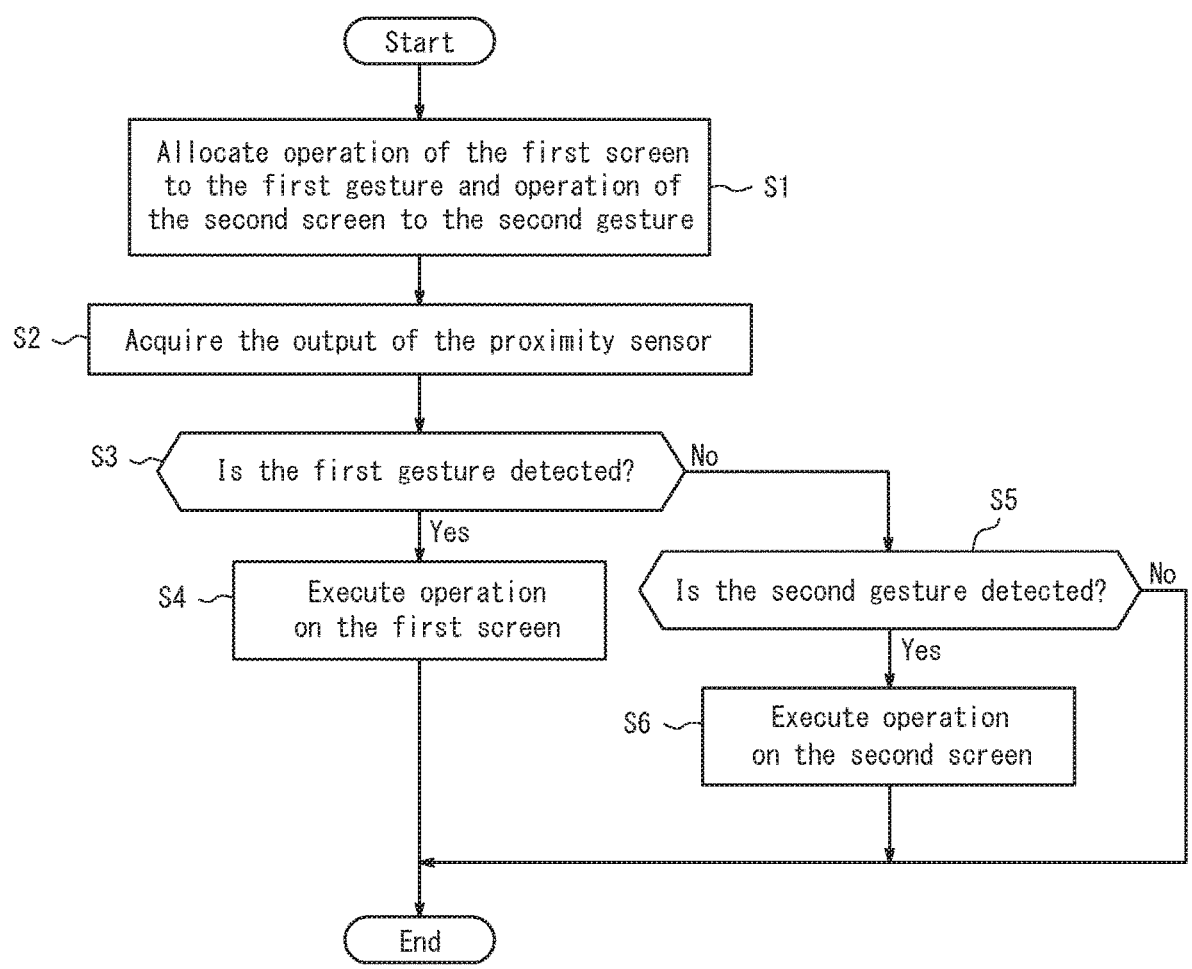
FIG. 7 is a flowchart illustrating an example of the first control method executed by an electronic device according to one embodiment.

FIG. 7 is a flowchart illustrating an example of the first control method executed at any point in time, at regular or irregular intervals, by the electronic device 1 according to one embodiment. "Any point in time" may, for example, refer to when the controller 11 detects that the electronic device 1 is in a predetermined mode and a plurality of windows are displayed.

The electronic device 1 allocates operation of the first window to the first gesture and operation of the second window to the second gesture (step S1). For example, the first gesture may be a horizontal gesture, a gesture performed in the upper area of the electronic device 1, or other such gesture. The second gesture may be a vertical gesture, a gesture performed in the lower area of the electronic device 1, or other such gesture. The electronic device 1 acquires the output of the proximity sensor 16 (step S2). By referring to the output, the electronic device 1 determines whether the first gesture is detected (step S3). Upon detecting the first gesture (step S3: Yes), the electronic device 1 executes the operation allocated to the first gesture on the first window (step S4).

Conversely, when determining that the first gesture is not detected (step S3: No), the electronic device 1 determines whether the second gesture is detected (step S5). Upon detecting the second gesture (step S5: Yes), the electronic device 1 executes the operation allocated to the second gesture on the second window (step S6).

Figure 8:
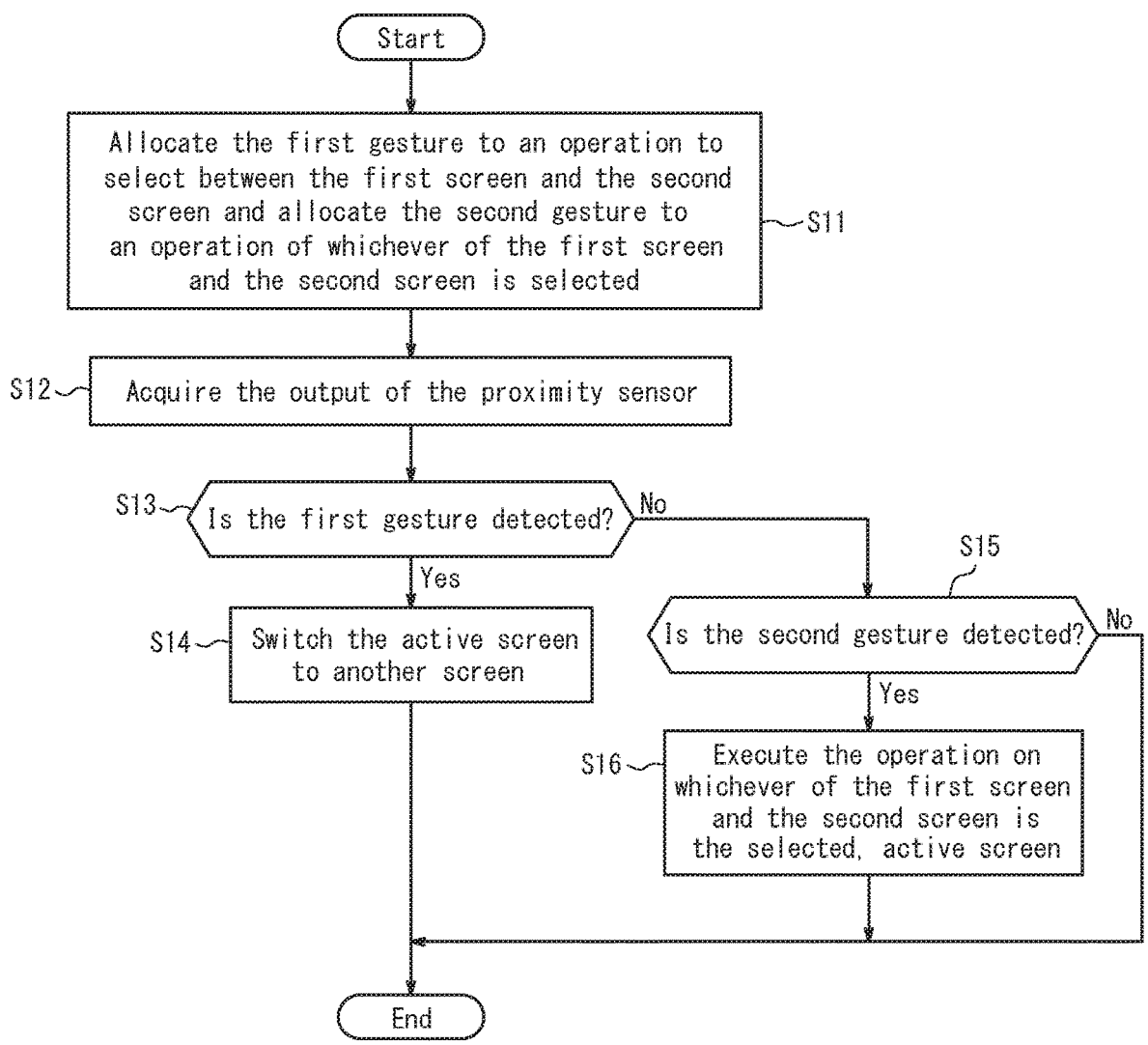
FIG. 8 is a flowchart illustrating an example of the second control method executed by an electronic device according to one embodiment.

FIG. 8 is a flowchart illustrating an example of the second control method executed at any point in time, at regular or irregular intervals, by the electronic device 1 according to one embodiment.

The electronic device 1 allocates the first gesture to an operation to select between the first window and the second window and allocates the second gesture to an operation of whichever of the first window and the second window is selected (step S11). The first gesture may, for example, be a horizontal gesture on a vertically scrolled window. The second gesture may, for example, be a vertical gesture on a vertically scrolled window. The electronic device 1 acquires the output of the proximity sensor 16 (step S12). By referring to the output, the electronic device 1 determines whether the first gesture is detected (step S13). Upon detecting the first gesture (step S13: Yes), the electronic device 1 switches the selected, active window to another window (step S14).

Conversely, when determining that the first gesture is not detected (step S13: No), the electronic device 1 determines whether the second gesture is detected (step S15). Upon detecting the second gesture (step S15: Yes), the electronic device 1 executes the operation allocated to the second gesture on whichever of the first window and the second window is the selected, active window (step S16).

Other Embodiments

Figure 9:
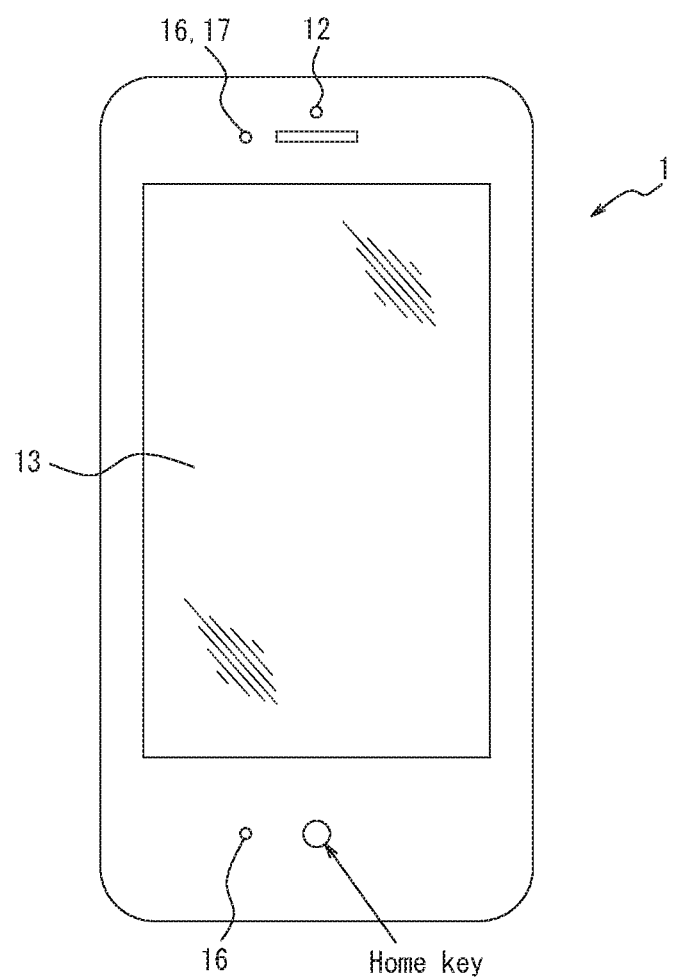
FIG. 9 is a schematic configuration diagram of an electronic device according to another embodiment.

In the above embodiment, only one proximity sensor 16 is provided at the lower portion of the electronic device 1. In another embodiment, as illustrated in FIG. 9, an additional proximity sensor 16 may be provided at the upper portion of the electronic device 1. In this case, the controller 11 may turn on the two proximity sensors 16 of the electronic device 1 when the second window is displayed. The controller 11 may then allocate operation of the first window displayed in the upper portion of the display 13 to a gesture detected by the proximity sensor 16 located at the upper portion of the electronic device 1. The controller 11 may also allocate operation of the second window displayed in the lower portion of the display 13 to a gesture detected by the proximity sensor 16 at the lower portion of the electronic device 1. Alternatively, instead of the proximity sensor 16 in the upper portion of the electronic device 1, the camera 12, which is a front camera, or the illumination sensor 17 may be used to detect a gesture. In this case, since the proximity sensor 16 is only disposed at the lower portion of the electronic device 1, the controller 11 adjusts the proximity reaction parameter of the proximity sensor 16 so that the proximity sensor 16 reacts and the display 13 can be turned off at the time of a phone call using the electronic device 1.

In the first control method, the controller 11 allocates operation of the first window to the first gesture and operation of the second window to the second gesture. As one example in another embodiment, three windows are displayed in partial overlap on the display 13. In this case, the controller 11 may allocate operation of the first window to the first gesture, operation of the second window to the second gesture, and operation of the third window to the third gesture. Alternatively, the controller 11 may designate the three overlapping windows as the first window, the second window, and the third window in order from the front. The controller 11 may then allocate operation of the first window to the first gesture and operation of the second window to the second gesture. In other words, the controller 11 may assign priorities to the plurality of windows and refrain from allocating a gesture to a window with a low assigned priority.

In the second control method, for example when only vertical scrolling is possible on both of the first window and the second window, and horizontal scrolling is not possible on either window, the controller 11 allocates a horizontal gesture to an operation to select the first window or the second window. As one example in another embodiment, the first gesture is allocated to an operation to select among the first window, the second window, and the third window, since three windows are displayed on the display 13. The same approach is taken when four or more windows are displayed on the display 13.

In the second control method, for example when only vertical scrolling is possible on both of the first window and the second window, and horizontal scrolling is not possible on either window, the controller 11 allocates a horizontal gesture to an operation to select the first window or the second window. In another embodiment, only horizontal scrolling is possible on both of the first window and the second window, and vertical scrolling is not possible on either window. In this case, the controller 11 allocates a vertical gesture to an operation to select which of the first window and the second window to make active and allocates a horizontal gesture to a horizontal scrolling operation on whichever of the first window and the second window is the active window.

In the above embodiment, the proximity sensor 16 is disposed at the lower portion of the electronic device 1, and the illumination sensor 17 is disposed at the upper portion of the electronic device 1. In another embodiment, the proximity sensor 16 and the illumination sensor 17 may be disposed at the lower portion of the electronic device 1.

Much of the subject matter of the present disclosure is described as a series of operations executed by a computer system and other hardware that can execute program instructions. Examples of the computer system and other hardware include a general-purpose computer, a Personal Computer (PC), a dedicated computer, a workstation, a Personal Communications System (PCS), a mobile (cellular) phone, a mobile phone with a data processing function, a Radio Frequency IDentification (RFID) receiver, a game machine, an electronic notepad, a laptop computer, a GPS receiver, and other programmable data processing apparatuses. It should be noted that in each embodiment, various operations are executed by a dedicated circuit (for example, individual logical gates interconnected in order to execute a particular function) implemented by program instructions (software), or by a logical block, program module, or the like executed by one or more processors. The one or more processors that execute a logical block, program module, or the like include, for example, one or more of a microprocessor, CPU, Application Specific Integrated Circuit (ASIC), Digital Signal Processor (DSP), Programmable Logic Device (PLD), Field Programmable Gate Array (FPGA), processor, controller, microcontroller, microprocessor, electronic device, other apparatus designed to be capable of executing the functions disclosed here, and/or a combination of any of the above. The embodiments disclosed here are, for example, implemented by hardware, software, firmware, middleware, microcode, or a combination of any of these. The instructions may be program code or a code segment for executing the necessary tasks. The instructions may be stored on a machine-readable, non-transitory storage medium or other medium. The code segment may indicate a combination of any of the following: procedures, functions, subprograms, programs, routines, subroutines, modules, software packages, classes, instructions, data structures, or program statements. The code segment may transmit and/or receive information, data arguments, variables, or memory content to or from another code segment or hardware circuit in order for the code segment to connect to another code segment or hardware circuit.

The storage used here may also be configured by a computer-readable, tangible carrier (medium) in the categories of solid-state memory, magnetic disks, and optical discs. Data structures and an appropriate set of computer instructions, such as program modules, for causing a processor to execute the techniques disclosed herein are stored on these media. Examples of computer-readable media include an electrical connection with one or more wires, a magnetic disk storage medium, a magnetic cassette, a magnetic tape, or other magnetic or optical storage medium, such as a Compact Disc (CD), laser Disc®, Digital Versatile Disc (DVD®), Floppy® disk, and Blu-ray Disc® (laser disc, DVD, floppy, and Blu-ray Disc are registered trademarks in Japan, other countries, or both). Further examples include a portable computer disk, Random Access Memory (RAM), Read-Only Memory (ROM), rewritable programmable ROM such as Erasable Programmable Read-Only Memory (EPROM), Electrically Erasable Programmable Read-Only Memory (EEPROM), or flash memory, another tangible storage medium that can store information, or a combination of any of these. The memory may be provided internal and/or external to a processor or processing unit. As used in this disclosure, the term "memory" refers to all types of long-term storage, short-term storage, volatile, non-volatile, or other memory. No limitation is placed on the particular type or number of memories, or on the type of medium for memory storage.

The invention claimed is:

1. An electronic device comprising:
 a first non-contact detection sensor;
 a second non-contact detection sensor;
 a display; and
 a controller configured to determine a first gesture and a second gesture by referring to output of the first non-contact detection sensor and the second non-contact detection sensor;
 wherein the controller, when a first window and a second window are displayed on the display,
  allocates operation of the first window to the first gesture detected by the first non-contact detection sensor, and
  allocates operation of the second window to the second gesture detected by the second non-contact detection sensor.

2. An electronic device comprising:
 a first non-contact detection sensor;
 a second non-contact detection sensor;
 a display; and
 a controller configured to determine a first gesture and a second gesture by referring to output of the first non-contact detection sensor and the second non-contact detection sensor;
 wherein the controller, when a first window and a second window are displayed on the display,
  allocates the first gesture detected by the first non-contact detection sensor to an operation to select between the first window and the second window, and allocates the second gesture detected by the second non-contact detection sensor to an operation of whichever of the first window and the second window is selected.

3. A control method for an electronic device comprising a first non-contact detection sensor and a second non-contact detection sensor, the control method comprising:
displaying a first window and a second window on a display;
determining a first gesture and a second gesture by referring to output of the first non-contact detection sensor and a second non-contact detection sensor;
allocating operation of the first window to the first gesture detected by the first non-contact detection sensor, and
allocating operation of the second window to the second gesture detected by the second non-contact detection sensor.

4. A control method for an electronic device comprising a first non-contact detection sensor and a second non-contact detection sensor, the control method comprising:
displaying a first window and a second window on a display;
determining a first gesture and a second gesture by referring to output of the first non-contact detection sensor and a second non-contact detection sensor;
allocating the first gesture detected by the first non-contact detection sensor to an operation to select between the first window and the second window, and
allocating the second gesture detected by the second non-contact detection sensor to an operation of whichever of the first window and the second window is selected.

5. The electronic device of claim 1, further comprising:
a storage,
wherein the storage is configured to store information allocating operation of the first window to the first gesture detected by the first non-contact detection sensor, and information allocating operation of the second window to the second gesture detected by the second non-contact detection sensor.

6. The electronic device of claim 2, further comprising:
a storage,
wherein the storage is configured to store information allocating the first gesture detected by the first non-contact detection sensor to the operation to select between the first window and the second window, and information allocating the second gesture detected by the second non-contact detection sensor to the operation of whichever of the first window and the second window is selected.

7. The control method of claim 3, wherein
the electronic device further comprises a storage, and
the storage is configured to store information allocating operation of the first window to the first gesture detected by the first non-contact detection sensor, and information allocating operation of the second window to the second gesture detected by the second non-contact detection sensor.

8. The control method of claim 4, wherein
the electronic device further comprises a storage, and
the storage is configured to store information allocating the first gesture detected by the first non-contact detection sensor to the operation to select between the first window and the second window, and information allocating the second gesture detected by the second non-contact detection sensor to the operation of whichever of the first window and the second window is selected.

9. The electronic device of claim 1, wherein
the controller, when the first window and the second window are both displayed on the display, activates the first non-contact detection sensor and the second non-contact detection sensor.

10. The electronic device of claim 2, wherein
the controller, when the first window and the second window are both displayed on the display, activates the first non-contact detection sensor and the second non-contact detection sensor.

11. The control method of claim 3, further comprising:
when the first window and the second window are both displayed on the display, activating the first non-contact detection sensor and the second non-contact detection sensor.

12. The control method of claim 4, further comprising:
when the first window and the second window are both displayed on the display, activating the first non-contact detection sensor and the second non-contact detection sensor.

* * * * *